United States Patent
Liu et al.

(10) Patent No.: US 11,756,929 B2
(45) Date of Patent: **\*Sep. 12, 2023**

(54) SEMICONDUCTOR PACKAGES

(71) Applicant: Taiwan Semiconductor Manufacturing Company, Ltd., Hsinchu (TW)

(72) Inventors: Zi-Jheng Liu, Taoyuan (TW); Chen-Cheng Kuo, Shin-Chu County (TW); Hung-Jui Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 171 days.

This patent is subject to a terminal disclaimer.

(21) Appl. No.: 17/335,086

(22) Filed: Jun. 1, 2021

(65) Prior Publication Data
US 2021/0288026 A1     Sep. 16, 2021

Related U.S. Application Data

(63) Continuation of application No. 16/907,317, filed on Jun. 22, 2020, now Pat. No. 11,322,479, which is a
(Continued)

(51) Int. Cl.
*H01L 25/065*     (2023.01)
*H01L 23/31*      (2006.01)
(Continued)

(52) U.S. Cl.
CPC ...... *H01L 25/0655* (2013.01); *H01L 21/6835* (2013.01); *H01L 23/3114* (2013.01); *H01L 23/5226* (2013.01); *H01L 23/5384* (2013.01); *H01L 23/5389* (2013.01); *H01L 24/06* (2013.01); *H01L 21/486* (2013.01); *H01L 21/561* (2013.01); *H01L 23/3128* (2013.01); *H01L 23/49816* (2013.01); *H01L 23/49827* (2013.01); *H01L 23/50* (2013.01); *H01L 2221/68345* (2013.01);
(Continued)

(58) Field of Classification Search
CPC ............ H01L 25/0655; H01L 23/3114; H01L 23/5226; H01L 23/5384; H01L 24/06
See application file for complete search history.

(56) References Cited

U.S. PATENT DOCUMENTS 9,000,584 B2    4/2015    Lin et al.
9,048,222 B2    6/2015    Hung et al.
(Continued)

FOREIGN PATENT DOCUMENTS

| TW | 201715674 | 5/2017 |
| TW | 201717335 | 5/2017 |
| TW | I594382   | 8/2017 |

*Primary Examiner* — Karen Kusumakar
(74) *Attorney, Agent, or Firm* — JCIPRNET

(57) ABSTRACT

A semiconductor package includes a first chip, a first chip and a molding compound. The first chip has a first via protruding from the first chip. The second chip has a second via protruding from the second chip, wherein a thickness of the first chip is different from a thickness of the second chip. The molding compound encapsulates the first chip, the second chip, the first via and the second via, wherein surfaces of the first via, the second via and the molding compound are substantially coplanar.

20 Claims, 20 Drawing Sheets

Related U.S. Application Data continuation of application No. 16/228,799, filed on Dec. 21, 2018, now Pat. No. 10,692,838, which is a continuation of application No. 15/793,998, filed on Oct. 26, 2017, now Pat. No. 10,163,858.

(51) Int. Cl.
| | | |
|---|---|---|
| *H01L 23/538* | (2006.01) | |
| *H01L 23/00* | (2006.01) | |
| *H01L 23/522* | (2006.01) | |
| *H01L 21/683* | (2006.01) | |
| *H01L 21/56* | (2006.01) | |
| *H01L 23/498* | (2006.01) | |
| *H01L 23/50* | (2006.01) | |
| *H01L 21/48* | (2006.01) | |

(52) U.S. Cl.
CPC ........... *H01L 2221/68359* (2013.01); *H01L 2224/02372* (2013.01); *H01L 2224/18* (2013.01); *H01L 2924/1431* (2013.01); *H01L 2924/1433* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2013/0207255 A1* | 8/2013 | Magnus ............... H01L 24/32 438/122 |
| 2017/0294409 A1 | 10/2017 | Yu et al. |

\* cited by examiner

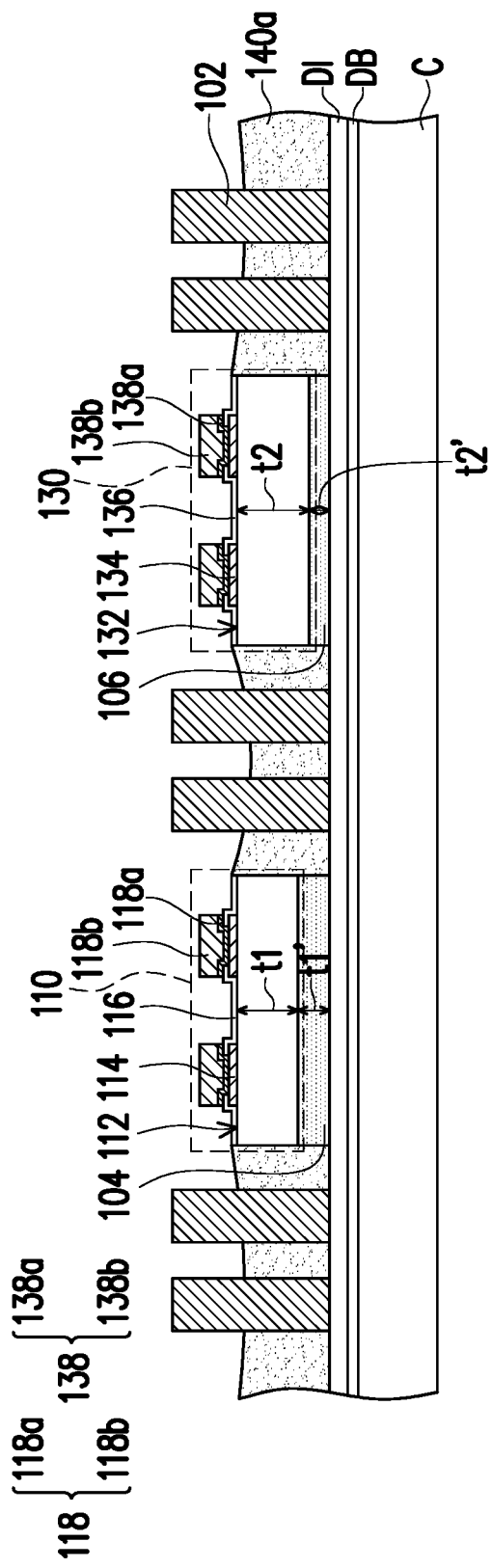
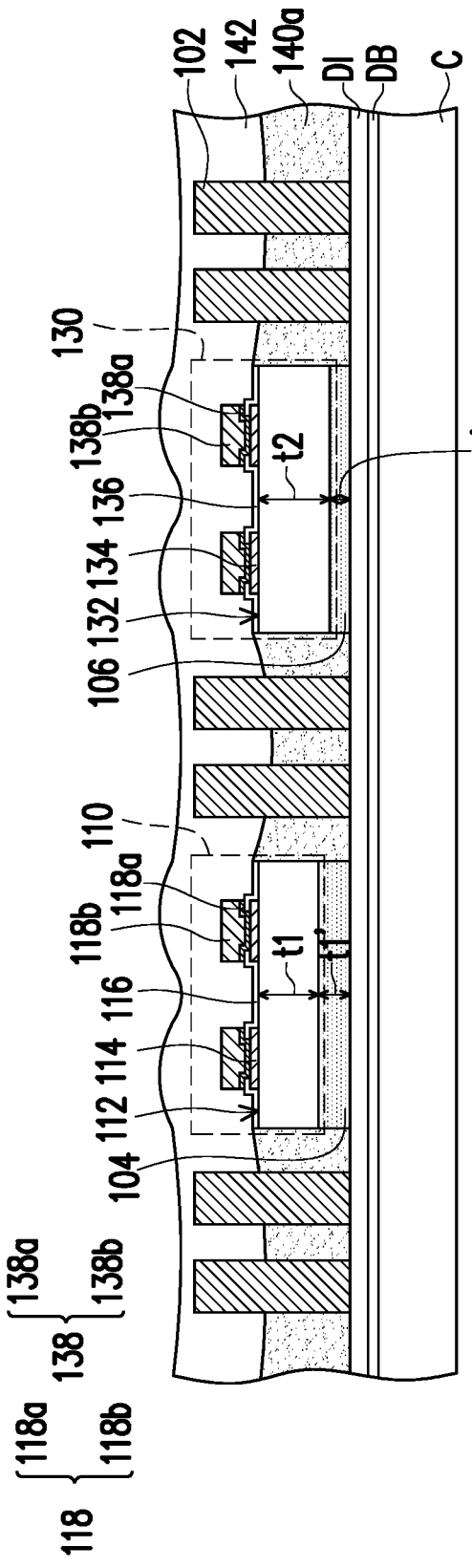
FIG. 3C
FIG. 3D

SEMICONDUCTOR PACKAGES

CROSS-REFERENCE TO RELATED APPLICATION

This application is a continuation application of and claims the priority benefit of U.S. patent application Ser. No. 16/907,317, filed Jun. 22, 2020. The prior application Ser. No. 16/907,317 is a continuation application of and claims the priority benefit of U.S. patent application Ser. No. 16/228,799, filed Dec. 21, 2018 and now issued as U.S. Pat. No. 10,692,838B2. The prior application Ser. No. 16/228,799 is a continuation application of and claims the priority benefit of U.S. patent application Ser. No. 15/793,998, filed Oct. 26, 2017 and now issued as U.S. Pat. No. 10,163,858B1. The entirety of each of the above-mentioned patent applications is hereby incorporated by reference herein and made a part of this specification.

BACKGROUND

Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3I are schematic cross sectional views of various stages in a manufacturing method of a semiconductor package according to some exemplary embodiments.

DETAILED DESCRIPTION

Figure 1A:
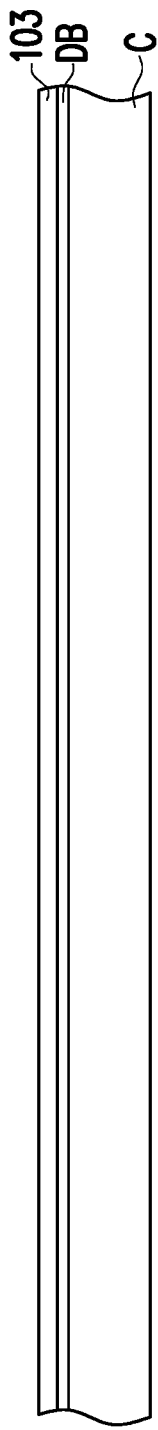
FIG. 1A to FIG. 1G are schematic cross sectional views of various stages in a manufacturing method of a semiconductor package according to some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic cross sectional views of various stages in a manufacturing method of a semiconductor package according to some exemplary embodiments. In exemplary embodiments, the semiconductor manufacturing method is part of a packaging process. In some embodiments, two chips are shown to represent plural chips, and one or more packages are shown to represent plural semiconductor packages obtained following the semiconductor manufacturing method.

Referring to FIG. 1A, a carrier C is provided. A de-bonding layer DB and an adhesive layer 103 are stacked over the carrier C in sequential order. In some embodiments, the de-bonding layer DB is formed on the upper surface of the carrier C, and the de-bonding layer DB is between the carrier C and the adhesive layer 103. The carrier C is, for example, a glass substrate. On the other hand, in some embodiments, the de-bonding layer DB is a light-to heat-conversion (LTHC) release layer formed on the glass substrate. In some embodiments, the adhesive layer 103 is a die attach film (DAF). However, the materials of the de-bonding layer DB, the carrier C, and adhesive layer 103 are merely for illustration, and the disclosure is not limited thereto.

Figure 1B:
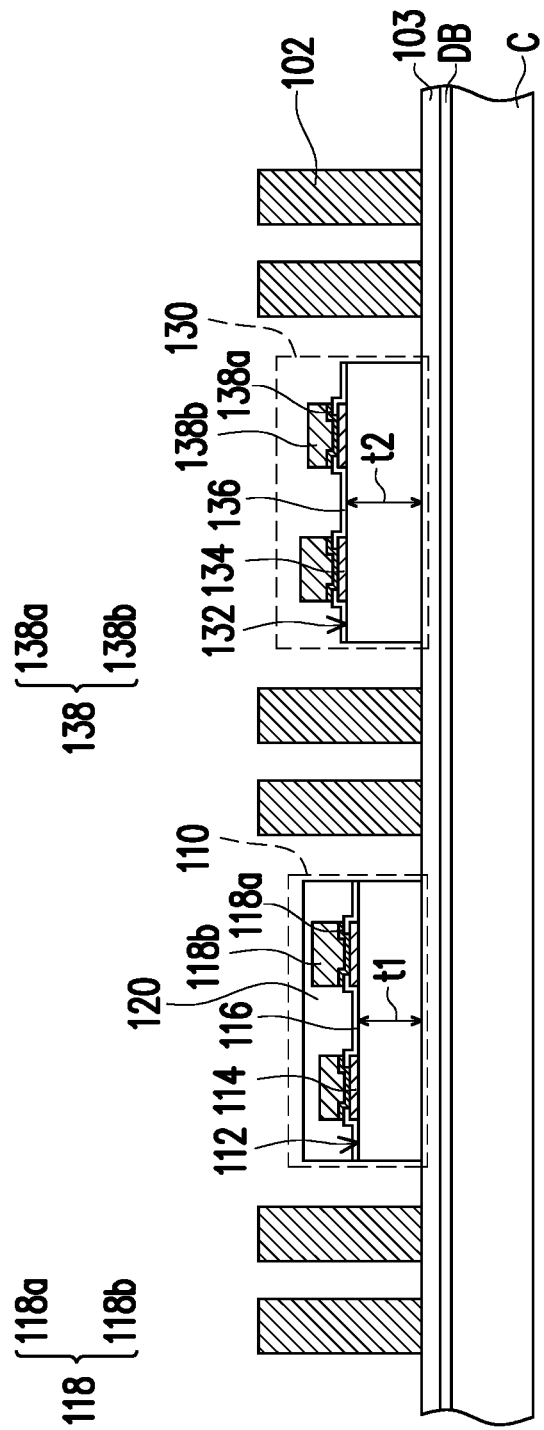

Referring to FIG. 1B, a plurality of through interlayer vias (TIVs) 102, a first chip/die 110 and a second chip/die 130 are provided over the carrier C. By using the adhesive layer 103, the first and second chips 110, 130 are placed onto the de-bonding layer DB having the TIVs 102 formed thereon. The first and second chips 110, 130 are adjacent to each other and are surrounded by the TIVs 102. In some embodiments, the first chip 110 and the second chip 130 may be the same types of chips or different types of chips and may be digital chips, analog chips or mixed signal chips, such as application-specific integrated circuit ("ASIC") chips, high bandwidth memory (HBM) chips, sensor chips, wireless and radio frequency chips, memory chips, logic chips or voltage regulator chips.

In some embodiments, the first chip 110 and the second chip 130 have different thickness t1, t2. In some embodiments, the first chip 110 includes the active surface 112, a plurality of pads 114 distributed on the active surface 112, a passivation layer 116 covering the active surface 112, a plurality of first vias 118, and a protection layer 120. The pads 114 are partially exposed by the passivation layer 116, the first vias 118 are disposed on and electrically connected to the pads 114, and the protection layer 120 covers the first vias 118 and the passivation layer 116. The first vias 118 may have different or the same height ranging from about 20 μm to about 25 μm measuring from the active surface 112 to its own top surface, for example. In exemplary embodiments, the first vias 118 includes a seed layer 118a and a metal layer 118b, and the seed layer 118a is merely disposed on a bottom of the metal layer 118b. Materials of the seed layer 118a and the metal layer 118b may include, for example, copper, copper alloys, or other suitable choice of materials. In some embodiments, the protection layer 120 may be a polybenzoxazole (PBO) layer, a polyimide (PI) layer or other suitable polymers. In some alternative embodiments, the protection layer 120 may be made of inorganic materials.

In some embodiments, the second chip 130 includes the active surface 132, a plurality of pads 134 distributed on the active surface 132, a passivation layer 136 covering the active surface 132, and a plurality of second vias 138. The pads 134 are partially exposed by the passivation layer 136, and the second vias 138 are disposed on and electrically connected to the pads 134. It is noted that the second vias 138 is exposed. In other words, compared with the first vias 118 covering by the protection layer 120 of the first chip 110, the second vias 138 of the second chip 130 are exposed without being covered. In exemplary embodiments, the second via 138 includes a seed layer 138a and a conductive layer 138b, and the seed layer 138a is merely disposed on a bottom of the conductive layer 138b. In some embodiment, the second vias 138 may have different or the same height ranging from about 20 μm to about 25 μm measuring from the active surface 112 to its own top surface, for example. The second vias 138 and the first vias 118 may have different or the same height. In some embodiments, the top surfaces of the second vias 138 are higher than the top surfaces of the first vias 118, for example. As illustrated in FIG. 1B, the top surfaces of the first and second chips 110, 130 are lower than the top surfaces of the TIVs 102. However, the disclosure is not limited thereto. In some alternative embodiments, the top surfaces of the first and second chips 110, 130 may be higher than or substantially coplanar with the top surfaces of the TIVs 102.

Figure 1C:
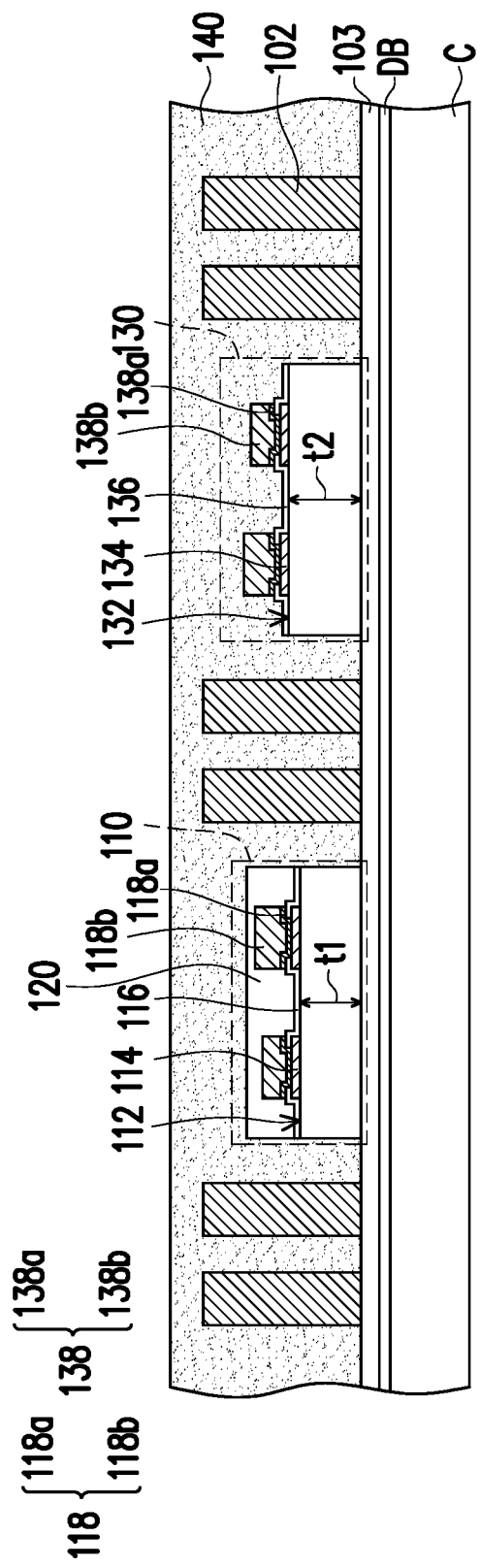

Referring to FIG. 1C, a molding compound 140 is formed over the carrier C to encapsulate the TIVs 102 and the first and second chips 110, 130. In some embodiments, the molding compound 140 is formed by a molding process. The TIVs 102, the protection layer 120 of the first chip 110 and the second vias 138 of the second chip 130 are encapsulated by the molding compound 140. In other words, the TIVs 102, the protection layer 120 of the first chip 110 and the second vias 138 of the second chip 130 are not revealed and are well protected by the molding compound 140. In some embodiments, the molding compound 140 may include epoxy or other suitable materials. In exemplary embodiments, the molding layer 140 may include a material without containing fillers.

Figure 1D:
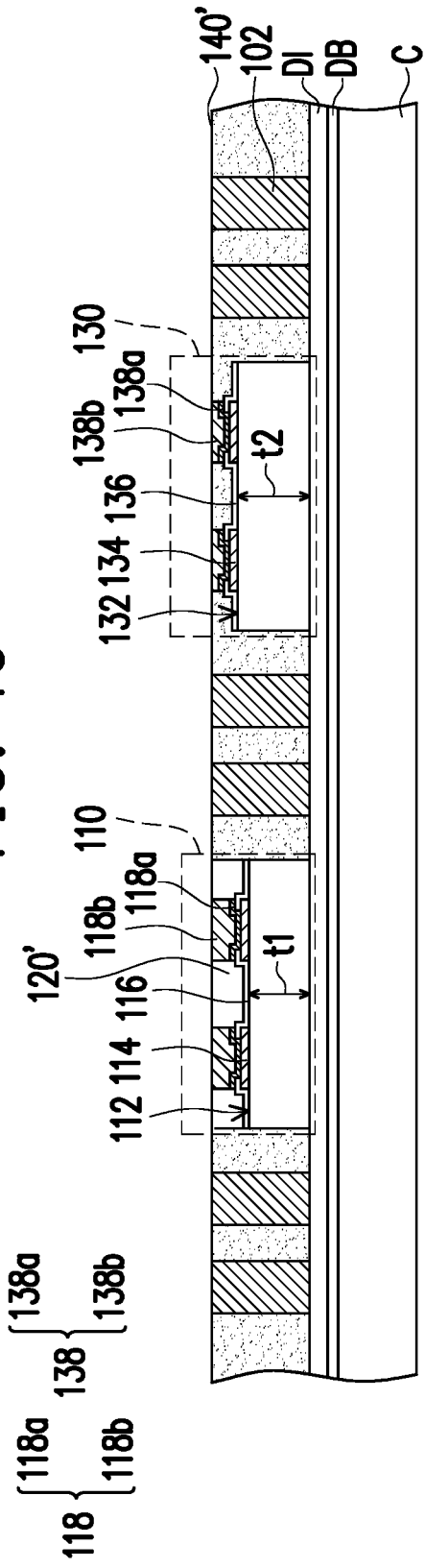

Referring to FIG. 1D, the molding compound 140 and the protection layer 120 of the first chip 110 are grinded until the top surfaces of the first and second vias 118, 138 are exposed. After the molding compound 140 is grinded, a molding layer 140' is formed over the adhesive layer 103. During the aforementioned grinding process, portions of the protection layer 120 are also grinded to form a protection layer 120'. In some embodiments, during the aforementioned grinding process of the molding compound 140 and the protection layer 120, portions of the first and second vias 118, 138 and portions of the TIVs 102 are grinded until the top surfaces of the first and second vias 118, 138 and the top surfaces of the TIVs 102 are exposed. In other words, the molding layer 140' exposes at least part of the first and second chips 110, 130 and at least part of the TIVs 102. In some embodiments, the molding layer 140' may be formed by a mechanical grinding, a chemical mechanical polishing (CMP), or another suitable mechanism.

The molding layer 140' encapsulates the sidewalls of the first and second chips 110, 130, the protection layer 120' and the second vias 138, and the molding layer 140' is penetrated by the TIVs 102. In other words, the first and second chips 110, 130 and the TIVs 102 are embedded in the molding layer 140'. It should be noted that although the first and second chips 110, 130 and the TIVs 102 are embedded in the molding layer 140', the molding layer 140' exposes the top surfaces of the first and second chips 110, 130 and the TIVs 102. In other words, the top surfaces of the TIVs 102, the top surface of the protection layer 120', and the top surfaces of the first and second vias 118, 138 are substantially coplanar with the top surface of the molding layer 140'. Furthermore, the second vias 138 are disposed in and contact with the molding layer 140' while the first vias 118 are disposed in and contact with the protection layer 120'.

Figure 1E:
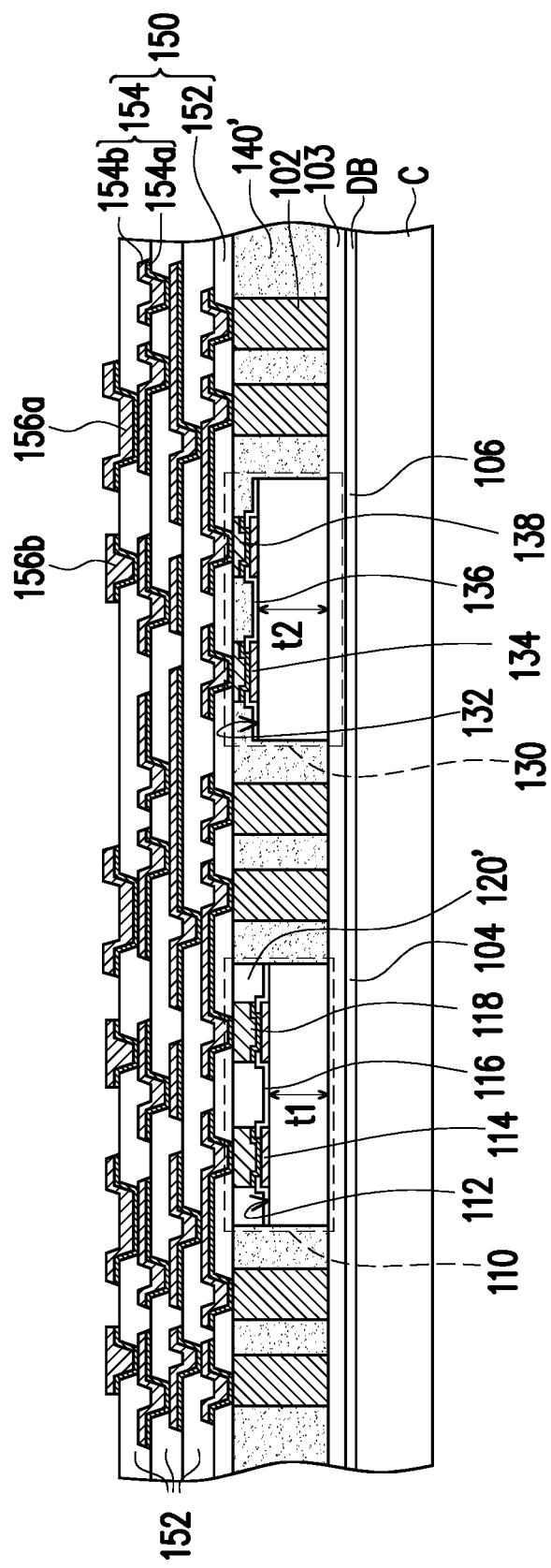

Referring to FIG. 1E, after the molding layer 140' and the protection layer 120' are formed, a redistribution layer 150 electrically connected to the first and second vias 118, 138 of the first and second chips 110, 130 and the TIVs 102 is formed on the top surfaces of the TIVs 102, the top surface of the molding layer 140', the top surfaces of the first and second vias 118, 138, and the top surface of the protection layer 120'. As shown in FIG. 1E, the redistribution layer 150 includes a plurality of inter-dielectric layers 152 and a plurality of redistribution conductive patterns 154 stacked alternately. The redistribution conductive patterns 154 are electrically connected to the first vias 118 embedded in the protection layer 120' and the second vias 138 and the TIVs 102 embedded in the molding layer 140'. In some embodiments, the top surfaces of the first and second vias 118, 138 and the top surfaces of the TIVs 102 are in contact with the bottommost redistribution conductive patterns 154 of the redistribution layer 150. The top surfaces of the first and second vias 118, 138 and the top surfaces of the TIVs 102 are partially covered by the bottommost inter-dielectric layer 152. In exemplary embodiments, the redistribution conductive patterns 154 include a seed layer 154a and a conductive layer 154b, and the seed layer 154a is disposed on a bottom of the conductive layer 154b. Furthermore, the topmost redistribution conductive patterns 154 include a plurality of pads. In some embodiments, the aforementioned pads include a plurality of under-ball metallurgy (UBM) patterns 156a for ball mount and/or at least one connection pad 156a for mounting of passive components. The number of the under-ball metallurgy patterns 156a and the connection pad 156a is not limited in this disclosure.

Figure 1F:
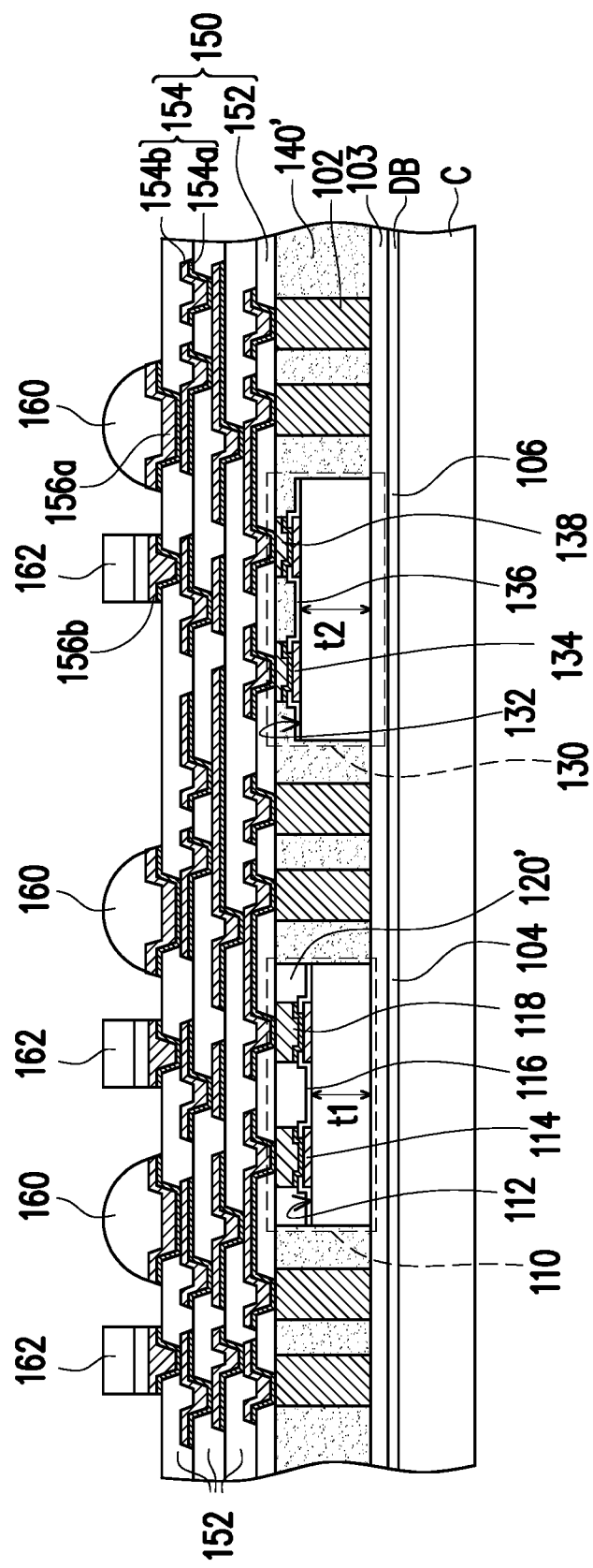

Referring to FIG. 1F, after the redistribution circuit structure 150 is formed, a plurality of conductive terminals 160 are placed on the under-ball metallurgy patterns 156a, and a plurality of passive components 162 are mounted on the connection pads 156b. In some embodiments, the conductive terminals 160 may be placed on the under-ball metallurgy patterns 156a through a ball placement process or other suitable processes and the passive components 162 may be mounted on the connection pads 156b through a soldering process, a reflowing process, or other suitable processes.

Figure 1G:
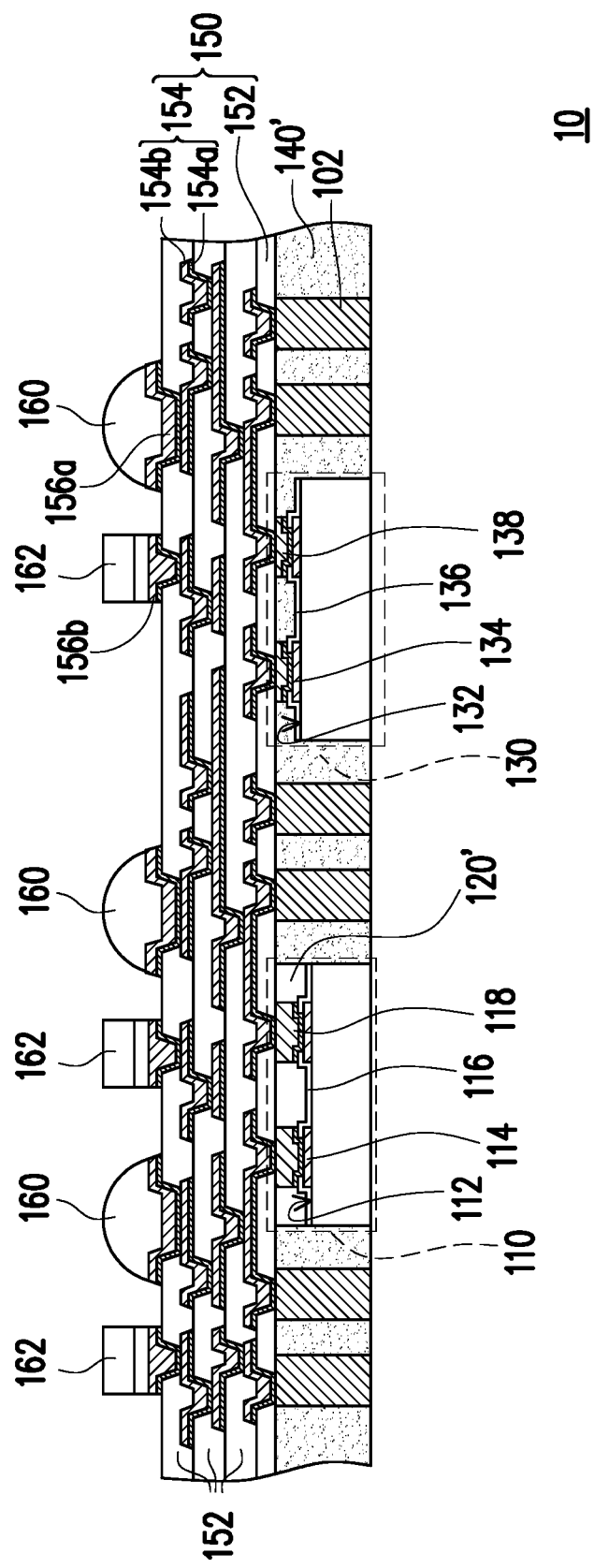

Referring to FIGS. 1F and 1G, after the conductive terminals 160 and the passive components 162 are mounted on the redistribution circuit structure 150, a structure of FIG. 1G is de-bonded from the carrier C. That is, the carrier C, the de-bonding layer DB and the adhesive layer 103 are removed. In some embodiments, the de-bonding layer DB (e.g., the LTHC release layer) may be irradiated by an UV laser. Herein, formation of an integrated fan-out (INFO) package 10 is substantially completed. In some embodiments, the INFO package 10 may be connected and/or stack with other electronic devices.

Figure 2:
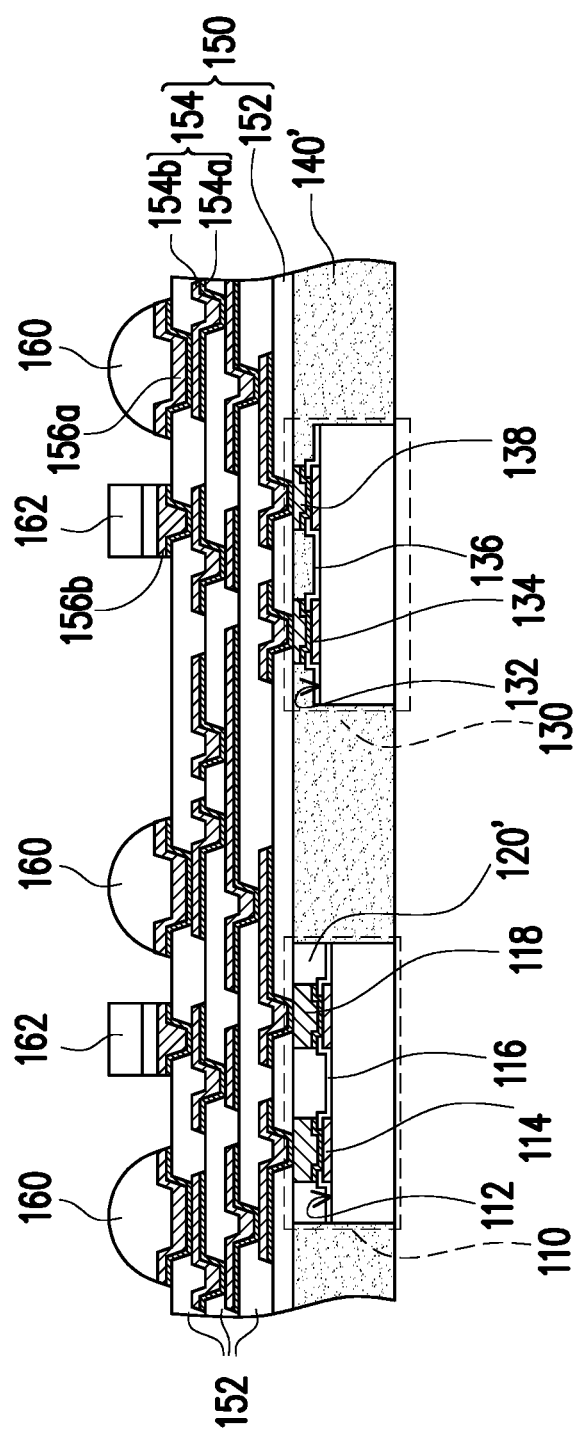
FIG. 2 is a schematic cross sectional view illustrating a semiconductor package according to some exemplary embodiments.

FIG. 2 is a schematic cross sectional view illustrating a semiconductor package according to some exemplary embodiments. In FIG. 2, a semiconductor package 10 similar to the structure as shown in FIG. 1G is described, except the TIVs are omitted. In the semiconductor package 10, the second vias 138 of the second chip 130 are disposed in the molding layer 140' and the top surface of the second vias 138 are substantially coplanar and flush with the polished top surface of the molding layer 140' and the top surfaces of the first vias 118 of the first chip 110.

In some embodiments, the thickness difference between the first and second chips and the height difference between the vias and the TIVs are eliminated by performing the planarization process. Therefore, the chips (such as different types of chips or chips from different supplier) having different thickness may be placed on the carrier for packaging. Furthermore, the second vias are encapsulated by the molding layer after the second chip adhering to the carrier while the first vias are encapsulated by the protection layer before the first chip adhering to the carrier. In other words, the first vias of the first chip are disposed in and contact with the protection layer, and the second vias of the second chip are disposed in and contact with the molding layer.

FIG. 3A to FIG. 3I are schematic cross sectional views of various stages in a manufacturing method of a semiconductor package according to some exemplary embodiments. In some embodiments, two chips are shown to represent plural chips, and one or more packages are shown to represent plural semiconductor packages obtained following the semiconductor manufacturing method. The elements similar to or substantially the same as the elements described above will use the same reference numbers, and certain details or descriptions of the same elements will not be repeated herein.

Figure 3A:
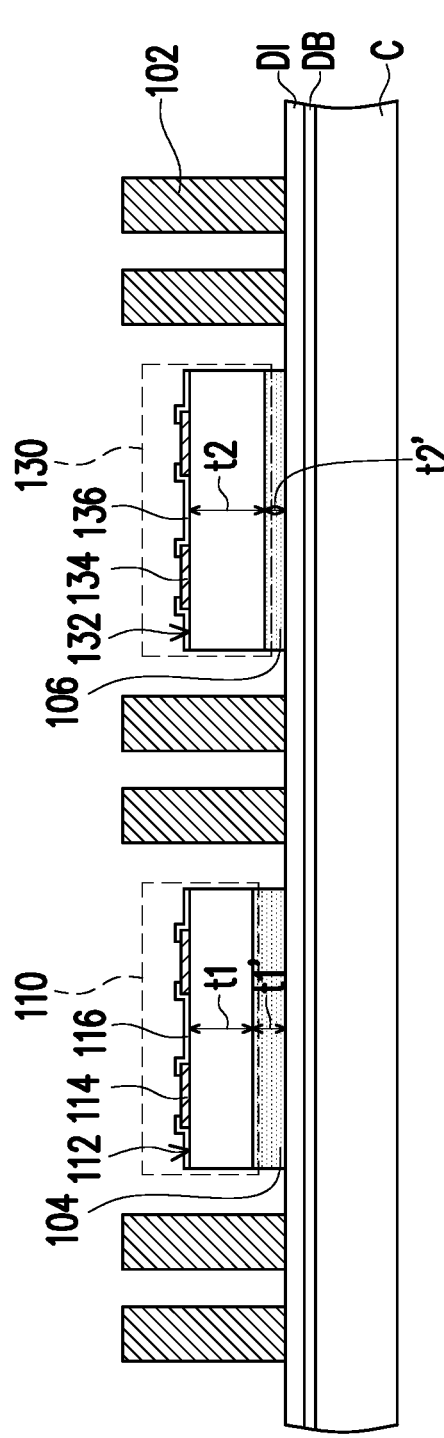

Referring to FIG. 3A, a carrier C is provided. In some embodiments, a de-bonding layer DB and a dielectric layer DI are stacked over the carrier C in sequential order. In some embodiments, the dielectric layer DI is, for example, polymer such as polyimide, benzocyclobutene (BCB), polybenzoxazole (PBO), or the like. In some alternative embodiments, the dielectric layer DI may include non-organic dielectric materials such as silicon oxide, silicon nitride, silicon carbide, silicon oxynitride, or the like. However, the material of the dielectric layer DI is merely for illustration, and the disclosure is not limited thereto.

Then, TIVs 120, a first chip 110 with a first adhesive layer 104 and a second chip 130 with a second adhesive layer 106 are provided over the dielectric layer DI. In exemplary embodiments, the first chip 110 and the second chip 130 have different thickness t1, t2. However, by adjusting thickness t1', t2' of the first adhesive layer 104 and the second adhesive layer 106, a total thickness of the first chip 110 and the first adhesive layer 104 is substantially equal to a total thickness of the second chip 130 and the second adhesive layer 106, for example, t1+t1'=t2+t2'. Therefore, active surfaces 112, 132 of the first and second chips 110, 130 are substantially coplanar. In some embodiments, the first chip 110 includes the active surface 112, a plurality of pads 114 distributed on the active surface 112 and a passivation layer 116 covering the active surface 112. In some embodiments, the second chip 130 includes the active surface 132, a plurality of pads 134 distributed on the active surface 132 and a passivation layer 136 covering the active surface 132. As illustrated in FIG. 3A, the top surfaces of the first and second chips 110, 130 are lower than the top surfaces of the TIVs 102, for example.

Figure 3B:
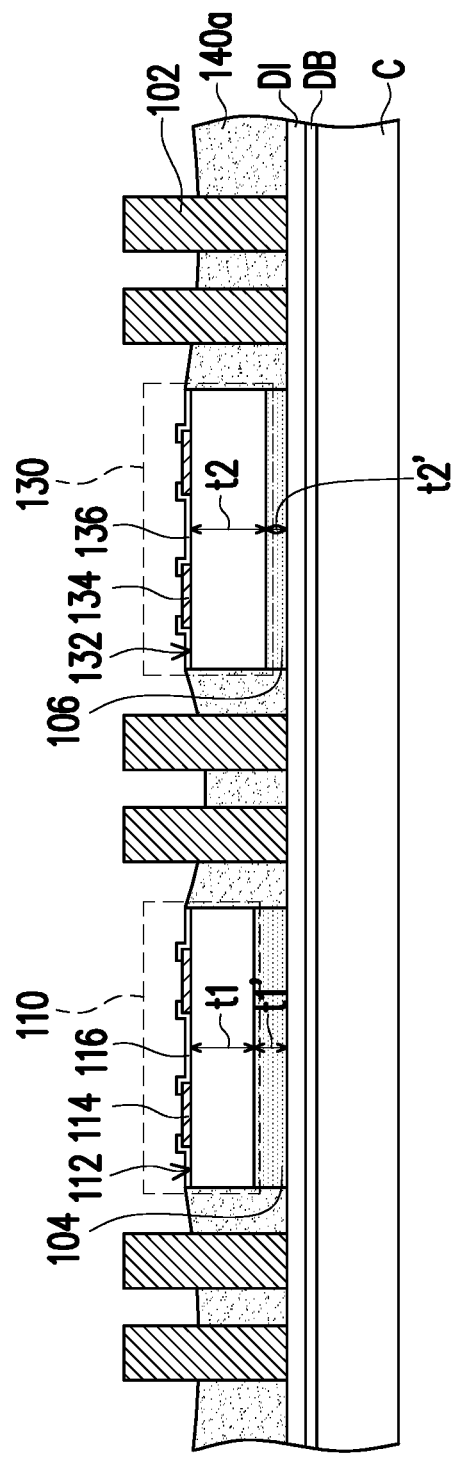

Referring to FIG. 3B, a molding layer 140a is formed over the carrier C to encapsulate the first and second chips 110, 130, and the top surface of the molding layer 140a is not higher than the active surfaces 112, 132 of the first and second chips 110, 130. In some embodiments, the first and second chips 110, 130 on the dielectric layer DI and a portion of the TIVs 120 located over the carrier C are encapsulated in the molding layer 140a. In some embodiments, the molding layer 140a covers the dielectric layer DI and fills between the first and second chips 110, 130 and the TIVs 120. In exemplary embodiments, the molding layer 140a is formed by using a mold chase (not shown) with a release film (not shown) attached to its inner surface to cover the active surfaces 112, 132 of the first and second chips 110, 130 and top portions of the TIVs 102 but with lateral sides of the first and second chips 110, 130 and bottom portions of the TIVs 102 being exposed. That is, the top surface of the molding layer 140a is lower than the active surfaces 112, 132 of the first and second chips 110, 130 and lower than the top surfaces of the TIVs 102. In exemplary embodiments, the top surface of the molding layer 140a has a dish-like depression due to the pressure from the release film. In exemplary embodiments, the material of the molding layer 140a includes at least one type of filler-containing resins and the resins may be epoxy resins, phenolic resins or silicon-containing resins. In exemplary embodiments, the fillers are made of non-melting inorganic materials and the fillers include metal oxide particles, silica particles or silicate particles with the average particle size ranging from about 3 μm to about 20 μm, from about 10 μm to about 20 μm or ranging from about 15 μm to about 20 μm. The surface roughness or surface flatness of the cured molding compound varies depending on fine or coarse filler particles added in the molding compound material. If a planarization process is performed on the molding compound, some pits may be formed in the molding compound due to the removal of the fillers, resulting in relatively large surface roughness or even unevenness and possible connection failure. In some embodiments, the molding layer 140a is formed without performing a planarization process.

Referring to FIG. 3C, first vias 118 and second vias 138 are respectively formed over the active surfaces 112, 132 of the first and second chips 110, 130. As shown in FIG. 3C, the molding layer 140a does not cover the top portions of the TIVs 102 are exposed from the molding layer 140a. That is, the first and second vias 118, 138 and the top portions of the TIVs 102 and are protruded from the top surface of the molding layer 140a. In exemplary embodiments, the first vias 118 and the second vias 138 have a seed layer 118a, 138a and a metal layer 118b, 138b, for example. The first vias 118 and the second vias 138 may be formed as follows. First, a seed layer is formed over the passivation layer 116, 126, and a mask having openings exposing a portion of the seed layer is formed over the passivation layer 116, 126. A material of the seed layer may include, for example, copper, copper alloys, or other suitable choice of materials. In some embodiments, the seed layer may be formed by physical vapor deposition or other applicable methods. Then, a metal material is filled into the openings of the mask, so as to form the metal layer 118b, 138b. In some embodiments, the metal material may be formed by a plating process. The plating process is, for example, electro-plating, electroless-plating, immersion plating, or the like. The metal material is, for example, copper, copper alloys, or the like. The seed layer and the metal material may include the same material. Afterwards, the mask is removed, and the seed layer is patterned to form the seed layer 118a, 138a. In some embodiments, the seed layer 118a, 138a is merely disposed on a bottom of the metal layer 118b, 138b, and no seed layer is disposed on a sidewall of the metal layer 118b, 138b. In some alternative embodiments, the seed layer may be omitted, and the first vias 118 and the second vias 138 may be formed by other suitable methods.

Referring to FIG. 3D, a dielectric layer 142 is formed on the molding layer 140a. The dielectric layer 142 is conformally formed with the underlying elements and the molding layer 140a. In other words, the top surface of the dielectric layer 142 is not planar. A material of the dielectric layer 142 is different from a material of the molding layer 140a, and the dielectric layer 142 contains no fillers. As shown in FIG. 3D, the dielectric layer 142 is formed over the molding layer 140a, the active surfaces 112, 132 of the first and second chips 110, 130 and the top portions of the first and second vias 118, 138 and the TIVs 102 exposed from the molding layer 140a, so that the entirety of the TIVs 102, the first and second chips 110, 130 and the first and second vias 118, 138 are encapsulated collectively by the molding layer 140a and the dielectric layer 142. In some embodiments, the first and second vias 118, 138 and the top portions of the TIVs 102 are encapsulated by the dielectric layer 142. That is, the top surface of the dielectric layer 142 is higher than the top surfaces of the TIVs 102 and higher than the top surfaces of the first and second vias 118, 138. In some embodiments, the thickness of the dielectric layer 142 (measuring from the top surface of the molding layer 140a to the top surface of the dielectric layer 142) ranges from about 10 μm to about 15 μm, for example. In exemplary embodiments, the material of the dielectric layer 142 includes a polymeric material free of fillers and the polymeric material is selected from low-temperature curable polyimide (PI) materials, high-temperature curable polyimide (PI) materials, photosensitive or non-photosensitive dry film materials, epoxy resins, benzocyclobutene, polybenzooxazole, or any other suitable dielectric material. In some embodiments, the dielectric layer 142 is formed by a coating process, a deposition process or other applicable methods.

Figure 3E:
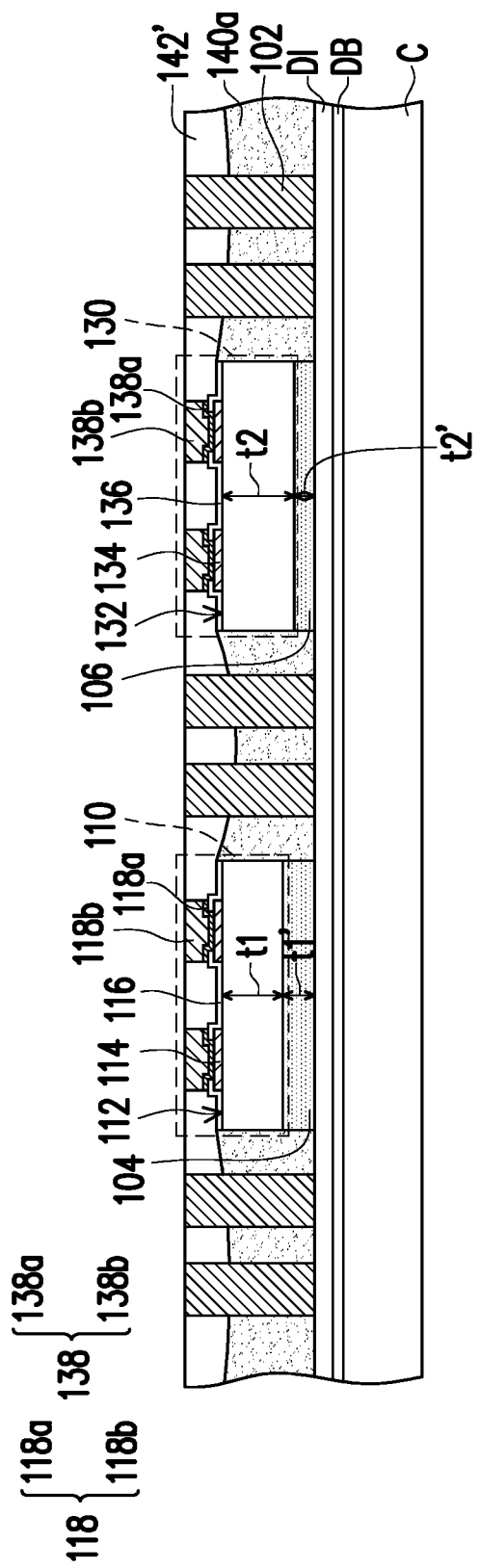

Referring to FIG. 3E, in some embodiments, a planarization process is performed on the dielectric layer 142 to form a dielectric layer 142', so that parts of the dielectric layer 142 and the TIVs 102 are removed and that the first and second vias 118, 138 of the first and second chips 110, 130 are exposed from the dielectric layer 142'. Alternatively, in one embodiment, parts of the first and second vias 118, 138 may be also removed. In some embodiments, after the planarization, the dielectric layer 142' has a planar top surface, and the first and second vias 118, 138, the TIVs 102 and the dielectric layer 142' become flattened and substantially levelled (i.e., the top surfaces of the first and second vias 118, 138 and the top surfaces of the TIVs 102 are substantially coplanar and flush with the polished top surface of the dielectric layer 142'). In some embodiments, the planarization process for planarizing the dielectric layer 142 and the TIVs 102 includes a fly cut process, a grinding process or a chemical mechanical polishing ("CMP") process. In some embodiments, the thickness of the planar dielectric layer 142' (measuring from the top surface of the molding layer 140a to the planar top surface of the dielectric layer 142') ranges from about 5 μm to about 10 μm, for example. The first and second vias 118, 138 and the TIVs 102 are exposed from the top surface of the planar dielectric layer 142' for further connection. The planar dielectric layer 142' and the molding layer 140a constitute a composite molding compound. As the material of the dielectric layer 142' does not contain fillers and has better flow ability, the dielectric layer 142' can offer better coverage and filling capability over the underlying elements and the molding layer 140a, leading to better surface flatness and structural integrity and strength for the composite structure of the molding layer 140a and the dielectric layer 142'.

Figure 3F:
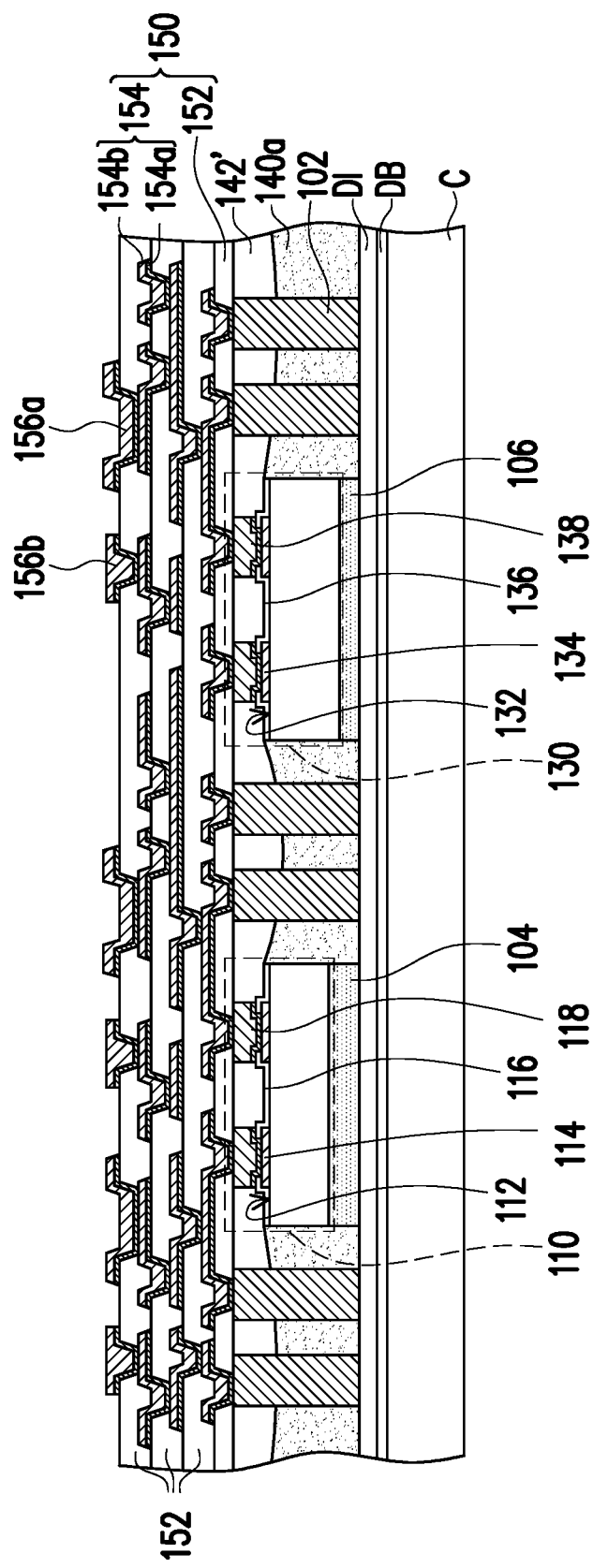

Referring to FIG. 3F, in some embodiments, a redistribution layer 150 electrically connected to the first and second vias 118, 138 of the first and second chips 110, 130 and the TIVs 102 is formed.

Figure 3G:
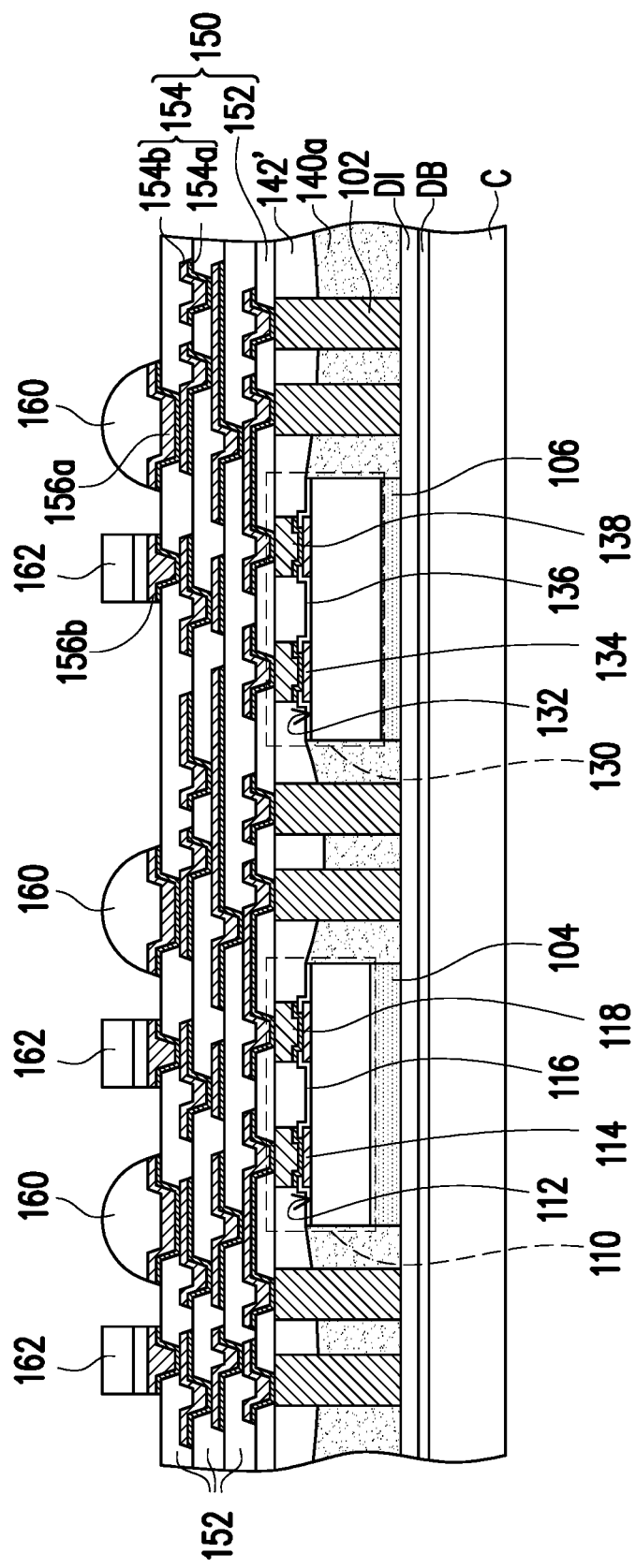

Referring to FIG. 3G, in some embodiments, after the redistribution circuit structure 150 is formed, a plurality of conductive terminals 160 are placed on the under-ball metallurgy patterns 156a, and a plurality of passive components 162 are mounted on the connection pads 156b.

Figure 3H:
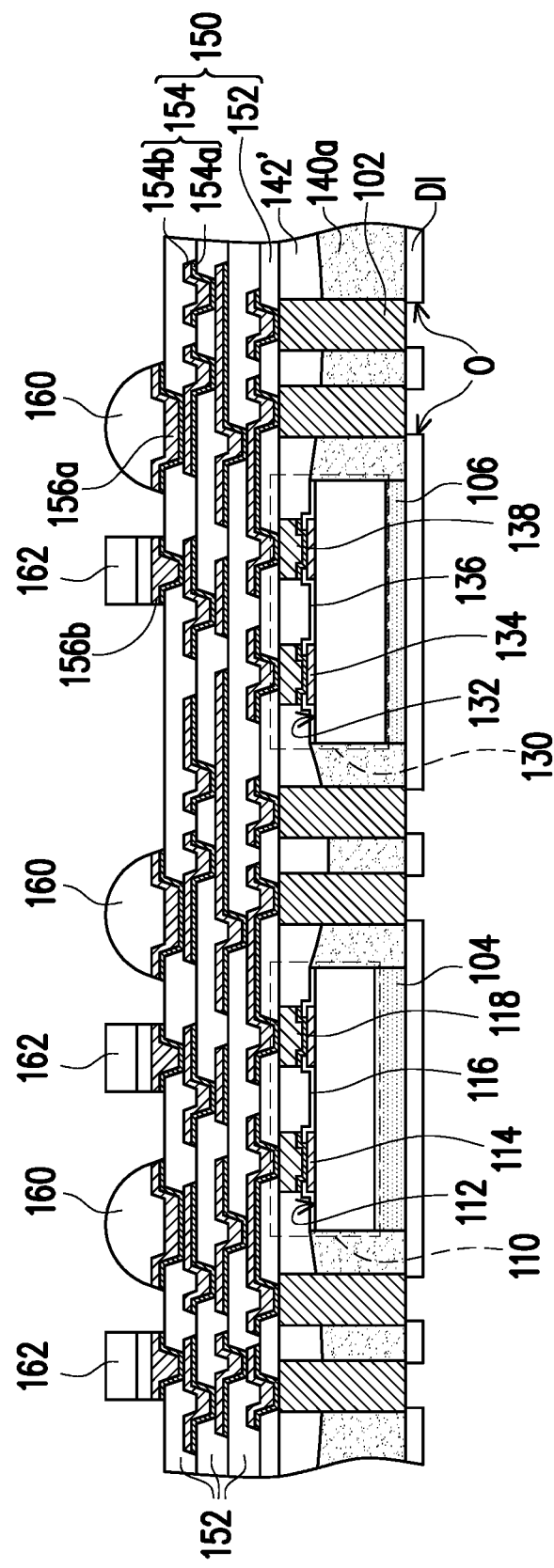

Referring to FIG. 3H, after the conductive terminals 160 and the passive components 162 are mounted on the redistribution circuit structure 150, the dielectric layer DI formed on the bottom surface of the molding layer 140a is de-bonded from the de-bonding layer DB such that the dielectric layer DI is separated from the carrier C. Then, a plurality of conductive terminals 164 are placed in the contact openings, and a plurality of contact openings O is formed to partially expose the TIVs 102. In some embodiments, the de-bonding layer DB (e.g., the LTHC release layer) may be irradiated by an UV laser such that the dielectric layer DI adhered on the bottom surface of the molding layer 140a is peeled from the carrier C. As illustrated in FIG. 3H, the dielectric layer DI is then patterned such that a plurality of contact openings O is formed to partially expose the TIVs 102. The number of the contact openings O corresponds to the number of the TIVs 102. In some embodiments, the contact openings O of the dielectric layer DI are formed by a laser drilling process, a mechanical drilling process, or other suitable processes.

Figure 3I:
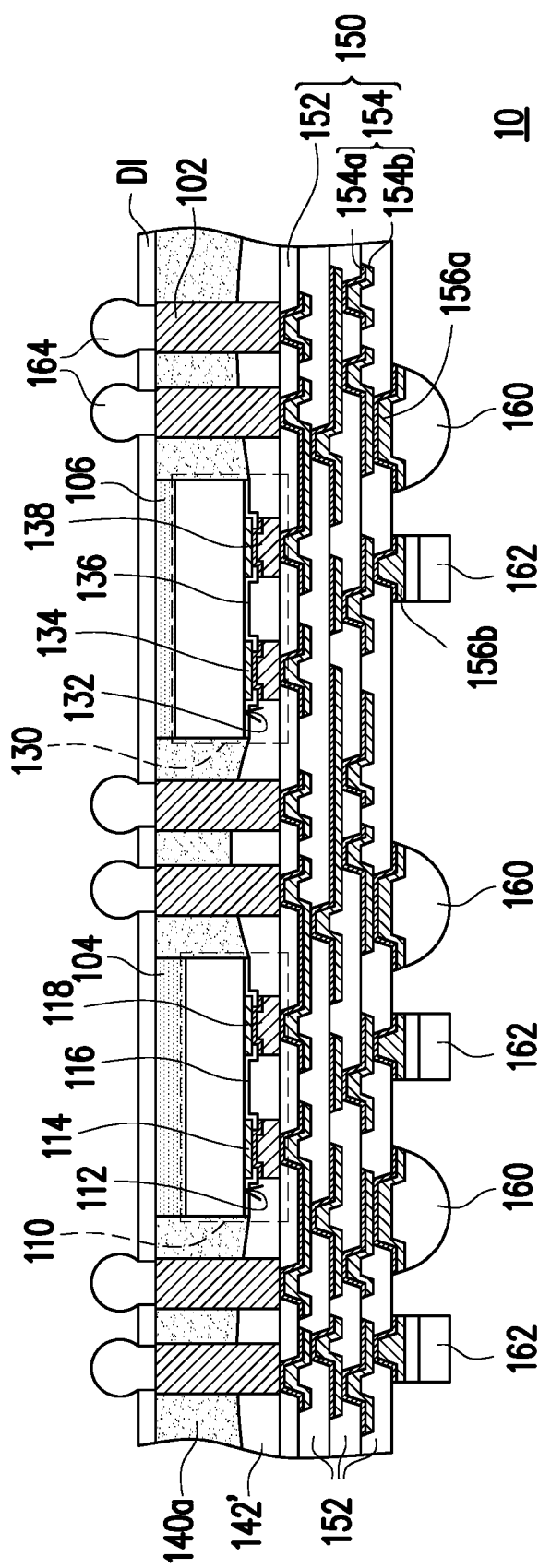

Referring to FIG. 3I, after the contact openings O are formed in the dielectric layer DI, a plurality of conductive terminals 164 are placed in the contact openings O, and the conductive terminals 164 are electrically connected to the TIVs 102. Herein, formation of an integrated fan-out (INFO) package 10 is substantially completed. In some embodiments, the INFO package 10 may be stack with other electronic devices. For example, another package such as an IC package is provided, and the package is stacked over and electrically connected to the INFO package 10 through the conductive terminals 164 such that the package-on-package (POP) structure is fabricated.

Figure 4:
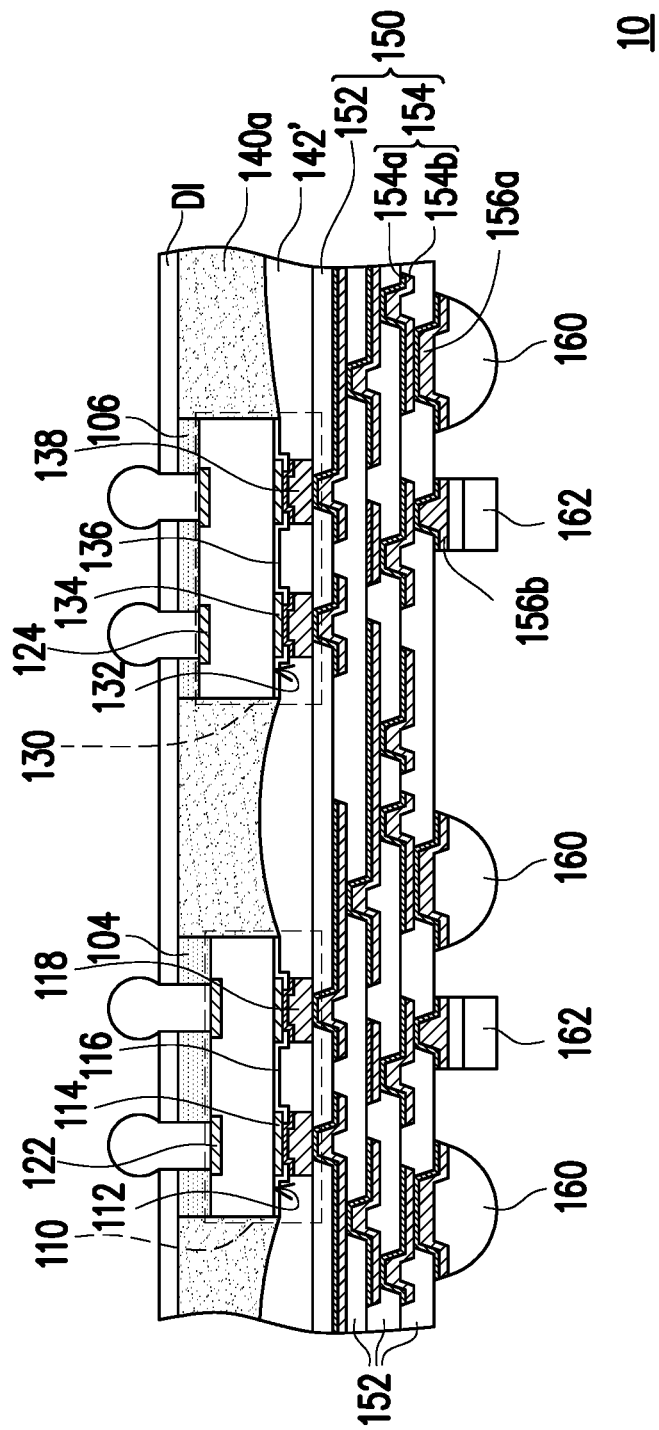
FIG. 4 is a schematic cross sectional view illustrating a semiconductor package according to some exemplary embodiments.

FIG. 4 is a schematic cross sectional view illustrating a semiconductor package according to some exemplary embodiments. In FIG. 4, a semiconductor package 10 similar to the structure as shown in FIG. 3I is described, except the TIVs are omitted. In some embodiments, the first and second chips 110, 130 have pads 122, 124 on surfaces opposite to the active surfaces 112, 132, the contact openings O are formed to partially expose the pads 122, 124, and the conductive terminals 164 are placed in the contact openings O corresponding to the pads 122, 124.

FIG. 5A to FIG. 5F are schematic cross sectional views of various stages in a manufacturing method of a semiconductor package according to some exemplary embodiments of the present disclosure. The difference between the method of FIG. 3C to FIG. 3I and the method of FIG. 5A to FIG. 5F lies the forming method of the first and second vias. The difference is illustrated in details below, and the similarity is not iterated herein.

Figure 5A:
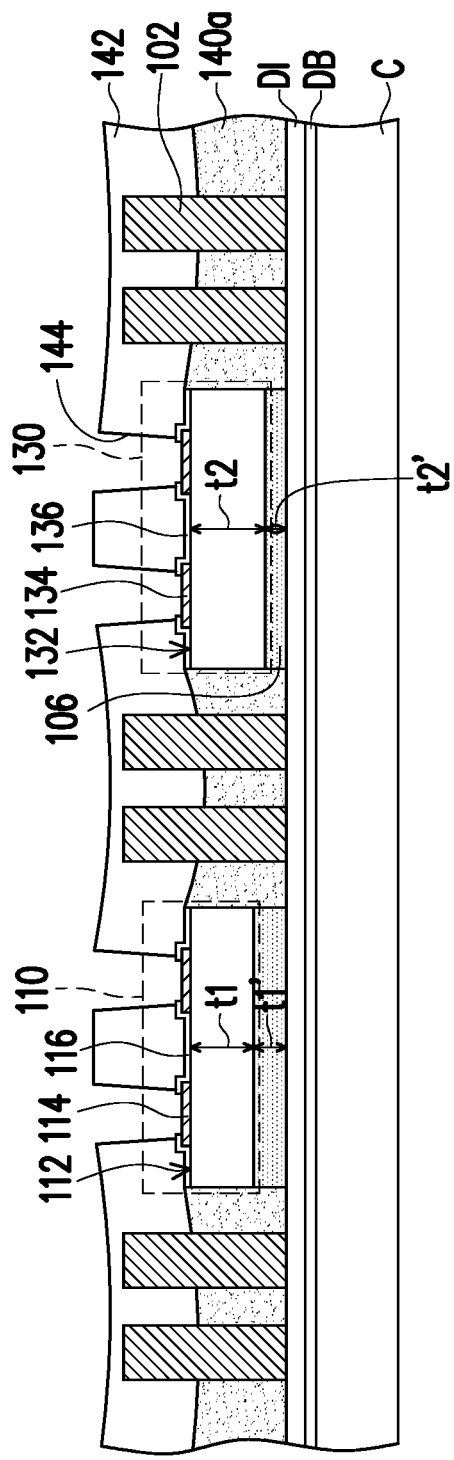
FIG. 5A to FIG. 5F are schematic cross sectional views of various stages in a manufacturing method of a semiconductor package according to some exemplary embodiments of the present disclosure.

Referring to FIG. 5A, a structure of FIG. 3B is provided, and a dielectric layer 142 having openings 144 is formed on a molding layer 140a, and portions of pads 114, 134 of first and second chips 110, 130 are exposed by the openings 144. In some embodiments, the dielectric layer 142 may be formed by physical vapor deposition or other applicable methods, and the openings 144 are formed by a photolithography process and an etching process. The dielectric layer 142 is substantially formed conformally with the underlying elements and the molding layer 140a, and thus the top surface of the dielectric layer 142 is not planar. In some embodiments, the top surface of the dielectric layer 142 is higher than the top surfaces of TIVs 102, and thus the TIVs 102 is encapsulated in the dielectric layer 142 and the molding layer 140a. The forming method, material and thickness of the dielectric layer 142 are similar to those described in FIG. 3D.

Figure 5B:
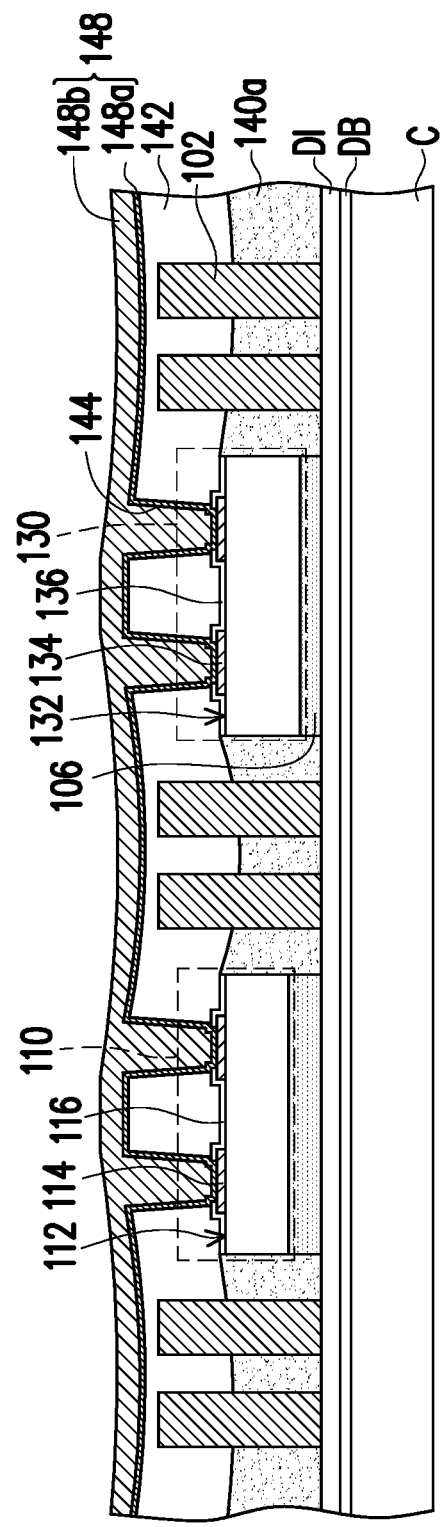

Referring to FIG. 5B, a conductive layer 148 is formed on the dielectric layer 142 and fills in the openings 144. In some embodiments, the conductive layer 148 is formed by forming a seed layer 148a on the top surface of the dielectric layer 142 and sidewalls and bottoms of the openings 144, and then forming a metal layer 148b on the seed layer 148a and filling the openings 144. The forming methods and materials of the seed layer 148a and the metal layer 148b are similar to those described in FIG. 3C.

Figure 5C:
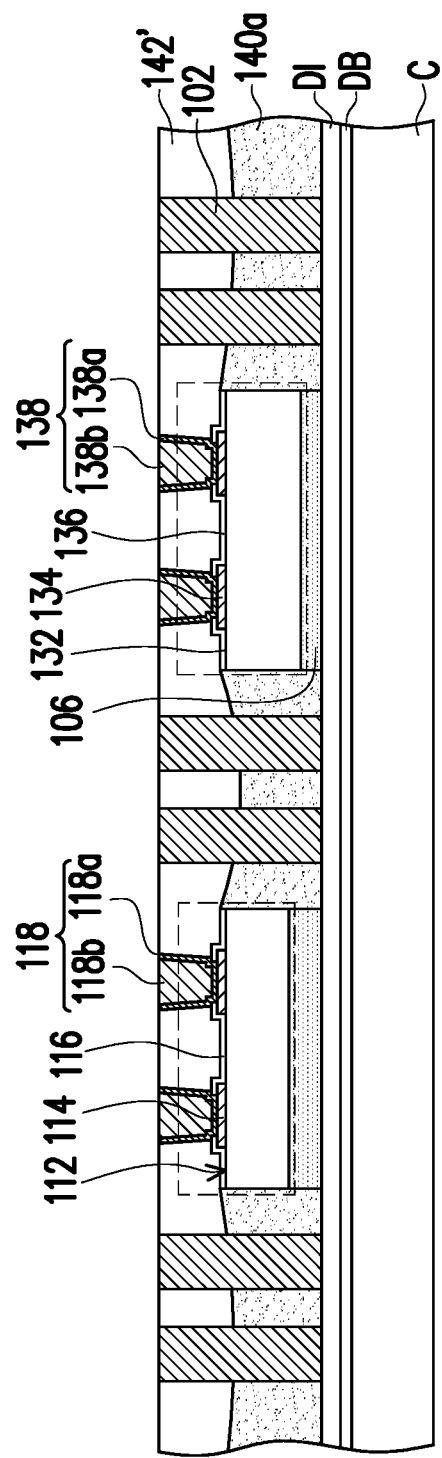

Referring to FIG. 5C, a planarization process is performed on the dielectric layer 142 and the conductive layer 148 to form a dielectric layer 142' and first and second vias 118, 138 in the dielectric layer 142'. In some embodiments, the planarization process for planarizing the dielectric layer 142, the TIVs 102 and the conductive layer 148 includes a fly cut process, a grinding process or a chemical mechanical polishing ("CMP") process. In some embodiments, the first vias 118 include a seed layer 118a and a metal layer 118b, and the second vias 138 include a seed layer 138a and a metal layer 138b. In some embodiments, after the planarization, the dielectric layer 142' has a planar top surface, and the first and second vias 118, 138, the TIVs 102 and the dielectric layer 142' become flattened and substantially levelled (i.e., the top surfaces of the first and second vias 118, 138 and the top surfaces of the TIVs 102 are substantially coplanar and flush with the polished top surface of the dielectric layer 142).

Figure 5D:
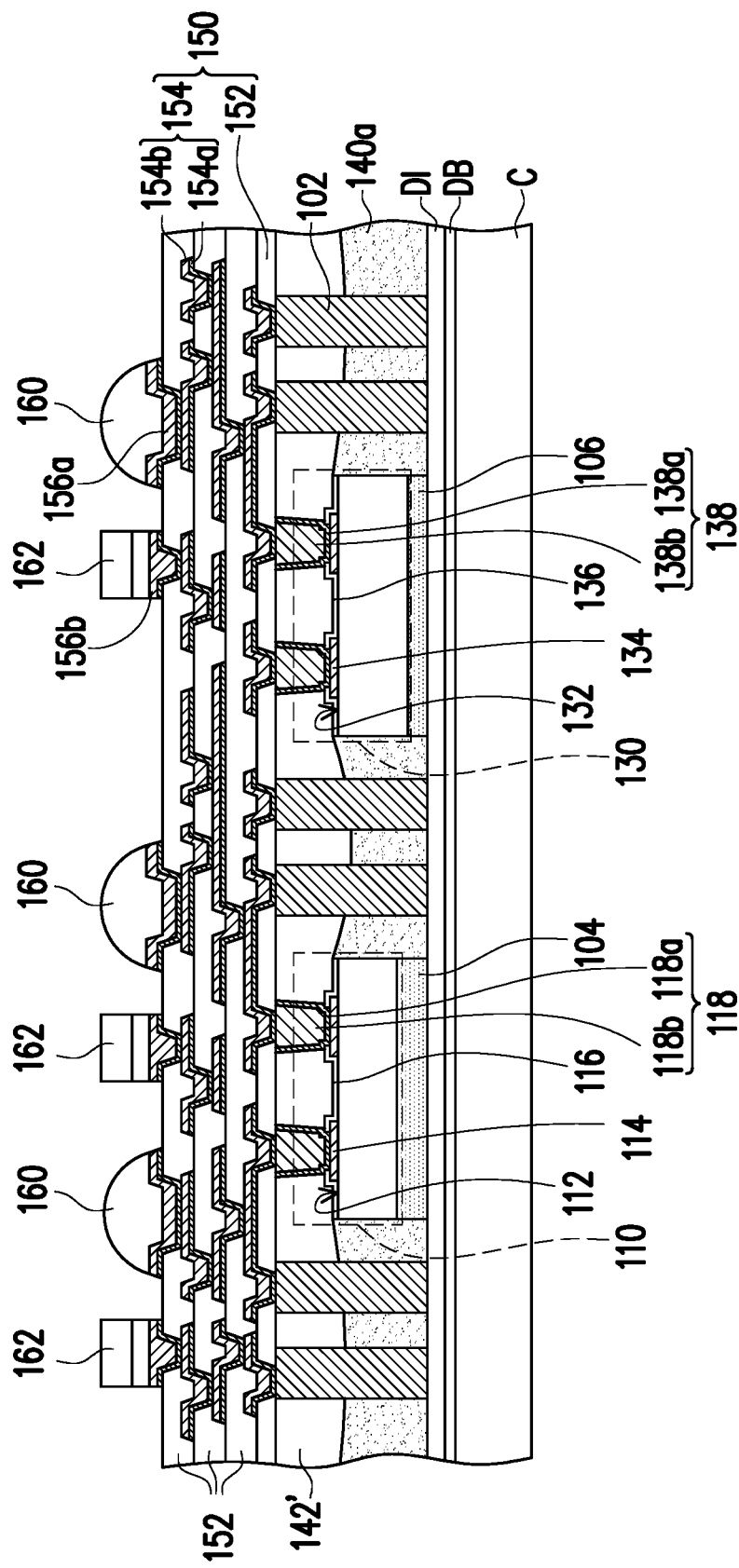

Referring to FIG. 5D, in some embodiments, a redistribution layer 150 electrically connected to the first and second vias 118, 138 of the first and second chips 110, 130 and the TIVs 102 is formed. After the redistribution circuit structure 150 is formed, a plurality of conductive terminals 160 are placed on the under-ball metallurgy patterns 156a, and a plurality of passive components 162 are mounted on the connection pads 156b.

Figure 5E:
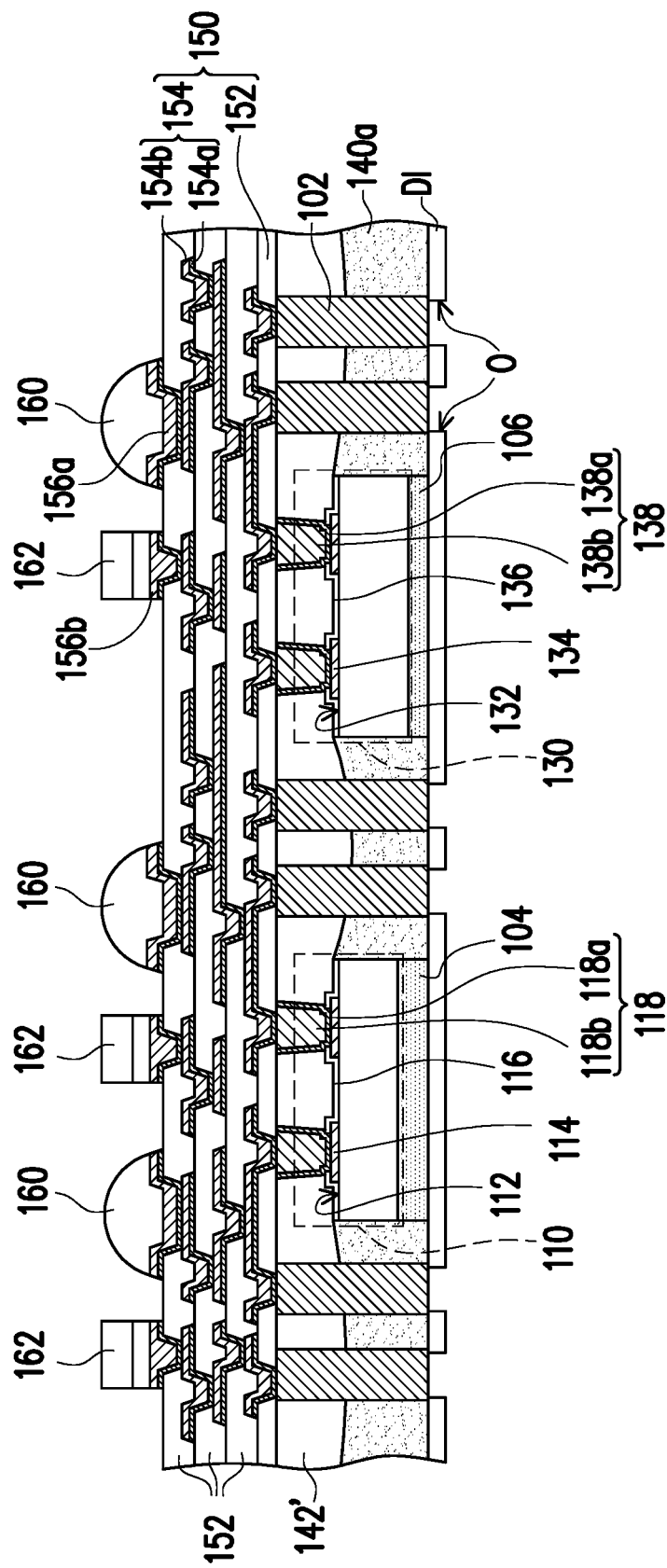

Referring to FIG. 5E, the dielectric layer DI formed on the bottom surface of the molding layer 140a is de-bonded from the de-bonding layer DB such that the dielectric layer DI is separated from the carrier C. Then, a plurality of conductive terminals 164 are placed in the contact openings, and a plurality of contact openings O is formed to partially expose the TIVs 102.

Figure 5F:
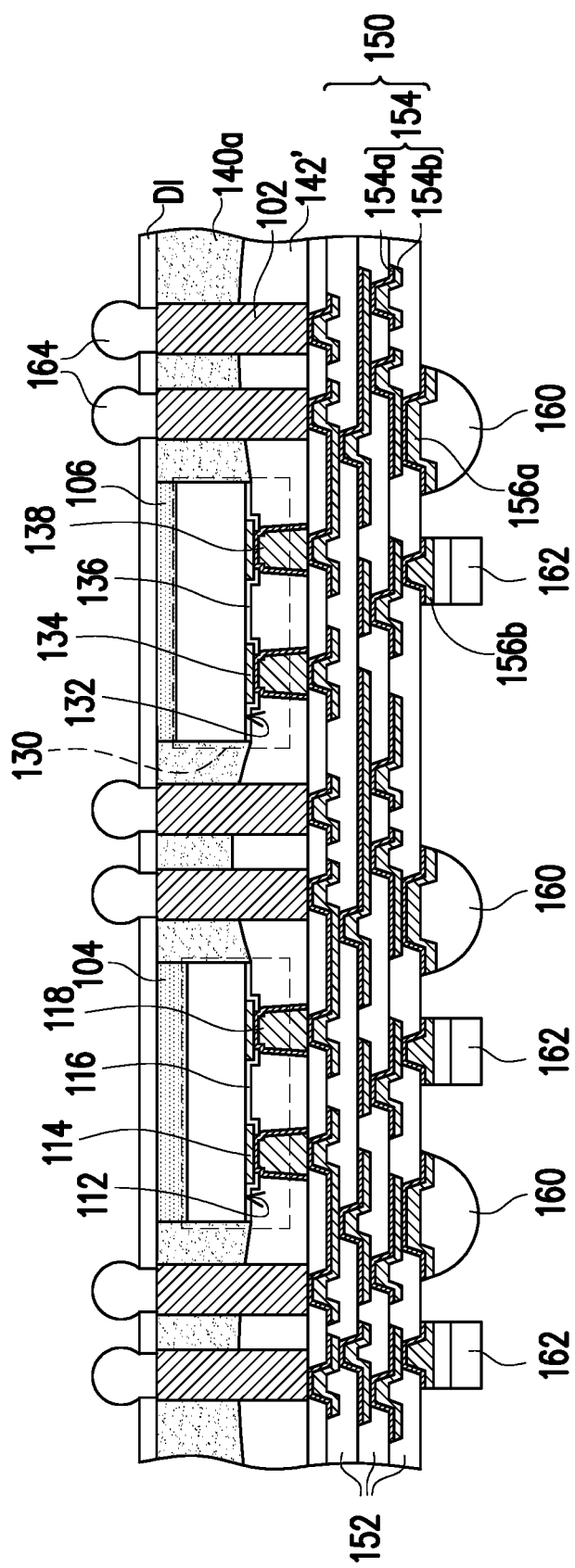

Referring to FIG. 5F, a plurality of conductive terminals 164 are placed in the contact openings O, and the conductive terminals 164 are electrically connected to the TIVs 102. Herein, formation of an integrated fan-out (INFO) package 10 is substantially completed.

Figure 6:
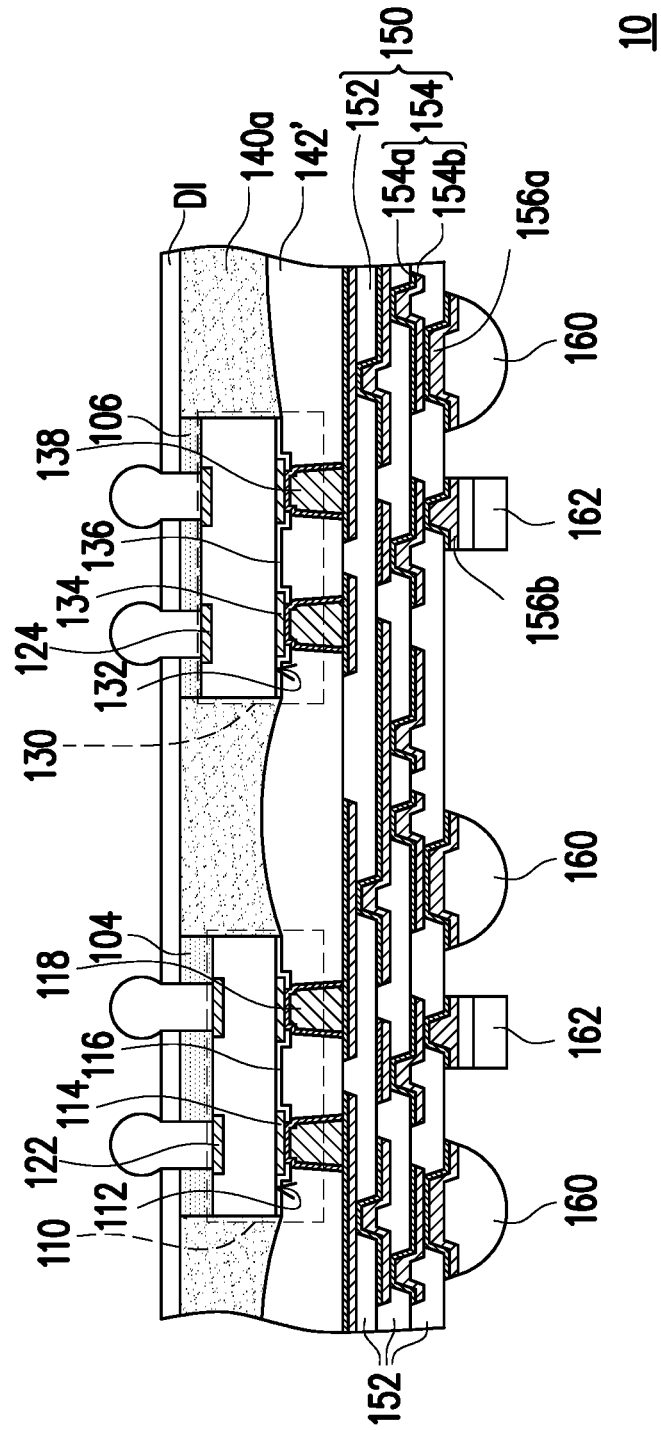
FIG. 6 is a schematic cross sectional view illustrating a semiconductor package according to some exemplary embodiments.

FIG. 6 is a schematic cross sectional view illustrating a semiconductor package according to some exemplary embodiments. In FIG. 6, a semiconductor package 10 similar to the structure as shown in FIG. 5F is described, except the TIVs are omitted. In some embodiments, the first and second chips 110, 130 have pads 122, 124 on surfaces opposite to the active surfaces 112, 132, the contact openings O are formed to partially expose the pads 122, 124, and the conductive terminals 164 are placed in the contact openings O. In addition, in some embodiments, the dielectric layer 142' is served as the bottommost inter-dielectric layer of the redistribution layer 150, and thus additionally forming the bottommost inter-dielectric layer can be omitted, which reduces the process and the cost of the semiconductor package.

In some embodiments, the thickness difference between the chips is compensated by adding the adhesive layers having different thickness. Therefore, the chips of different types may be placed on the carrier for packaging. In some embodiments, the molding layer is formed with the top surface not higher than the active surface of the chips, that is, the molding layer is not formed by an over-molding technique. Therefore, a planarization process for the molding layer is not required, and the pits concern caused by performing the planarization process on the molding layer including the fillers is prevented. Furthermore, the dielectric layer is formed over the molding layer and planarized to provide a better planar surface, beneficial for the later formed metal lines or wirings thereon, especially for metal lines with fine line/space. Moreover, the dielectric layer provides insulation for the vias of the chips, and thus a passivation layer for the vias of the chips are not required. In other words, formation of the molding layer and the dielectric layer covering the molding layer provides flexibility in material choices, larger process window for the molding layer and improved reliability for the redistribution layer having fine line/space and simplicity of the manufacturing method. Therefore, the cost of the semiconductor package may be lowered and the performance of the semiconductor package may be improved.

According to some embodiments, a semiconductor package includes a first chip, a second chip, a first adhesive layer, a second adhesive layer and a molding layer. The first adhesive layer is disposed on a first surface of the first chip and a second adhesive layer is disposed on a second surface of the second chip, wherein the first adhesive layer and the second adhesive layer have different thickness, and a total thickness of the first chip and the first adhesive layer is substantially equal to a total thickness of the second chip and the second adhesive layer. The molding layer encapsulates the first chip, the second chip, the first adhesive layer and the second adhesive layer.

According to some embodiments, a semiconductor package includes a first chip, a second chip and a molding layer. The first chip has a first adhesive layer thereon. The second chip has a second adhesive layer thereon, wherein a thickness of the first adhesive layer is different from a thickness of the second adhesive layer. The molding layer encapsulates the first chip and the second chip, wherein a top surface of the molding layer is not higher than top surfaces of the first chip and the second chip.

According to some embodiments, a semiconductor package includes a first chip, a molding layer and a dielectric layer. The first chip has an active surface and a first via on the active surface. The molding layer encapsulates the first chip, wherein a top surface of the molding layer is not higher than the active surface of the first chip. The dielectric layer is disposed over the molding layer, wherein the first via is disposed in the dielectric layer, and a top surface of the first via is substantially coplanar with a top surface of the dielectric layer.

According to some embodiments, a semiconductor package includes a first chip, a plurality of through vias and an encapsulant. The first chip has a first via and a protection layer thereon. The first via is disposed in the protection layer. The through vias are disposed aside the first chip. The encapsulant encapsulates the first chip and the plurality of through vias. A surface of the encapsulant is substantially coplanar with surfaces of the protection layer and the plurality of through vias.

According to some embodiments, a semiconductor package includes a first chip, a second chip, a molding compound, a first dielectric layer and a redistribution layer. The first chip has a first surface and a first via on the first surface. The second chip has a second surface and a second via on the second surface. The molding compound encapsulates the first chip and the second chip and exposes the first surface and the second surface. The first dielectric layer is disposed over a surface of the molding compound, the first surface of the first chip and the second surface of the second chip. The redistribution layer is disposed over the first dielectric layer, electrically connects to the first chip and the second chip through the first via and the second via, and includes a first conductive pattern being in direct contact with a top surface of the first dielectric layer and a top surface of the first via.

According to some embodiments, a manufacturing method of a semiconductor package includes the following steps. A first chip having a protection layer and a first via in the protection layer is provided. A second chip having a second via thereon is provided. The first chip and the second chip are encapsulated by an encapsulant. A planarization process is performed until surfaces of the encapsulant, the first via, the protection layer and the second via are substantially coplanar.

According to some embodiments, a semiconductor package includes a first chip, a first chip and a molding compound. The first chip has a first via protruding from the first chip. The second chip has a second via protruding from the second chip, wherein a thickness of the first chip is different from a thickness of the second chip. The molding compound encapsulates the first chip, the second chip, the first via and the second via, wherein surfaces of the first via, the second via and the molding compound are substantially coplanar.

According to some embodiments, a semiconductor package includes a first chip, a second chip and a molding compound. The first chip has a first via extended from the first chip. The second chip has a second via extended from the second chip, wherein a height of an extending portion of the first via is different from a height of an extending portion of the second via. The molding compound encapsulates the first chip, the second chip, the first via and the second via.

According to some embodiments, a semiconductor package includes a first chip, a second chip and a molding compound. The first chip has a first electrical connector. The second chip has a second electrical connector. A surface of the molding compound is substantially coplanar with surfaces of the first electrical connector and the second electrical connector, and at least one of the first and second electrical connector is separated from the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
  a first chip, having a first via protruding from a first active surface of the first chip;
  a second chip, having a second via protruding from a second active surface of the second chip, wherein a thickness of the first chip is different from a thickness of the second chip; and
  a molding compound, encapsulating the first chip, the second chip, the first via and the second via, wherein surfaces of the first via, the second via and the molding compound are substantially coplanar.

2. The semiconductor package as claimed in claim 1, wherein a total thickness of the first chip and the first via is substantially the same as a total thickness of the second chip and the second via.

3. The semiconductor package as claimed in claim 1, wherein the first via has a first portion and a second portion, and a width of the first portion is different from a width of the second portion.

4. The semiconductor package as claimed in claim 1, wherein the first active surface is connected to a conductive routing and the second active surface is connected to the conductive routing.

5. The semiconductor package as claimed in claim 1 further comprising a conductive routing aside the surface of the molding compound and electrically connected to at least one of the first via and the second via.

6. The semiconductor package as claimed in claim 1 further comprising a protection layer encapsulating the first via over the first chip, wherein a surface of the protection layer is substantially coplanar with the surfaces of the first via, the second via and the molding compound.

7. A semiconductor package, comprising:
  a first chip, having a first via extended from and in direct contact with the first chip;
  a second chip, having a second via extended from and in direct contact with the second chip, wherein a height of an extending portion of the first via is different from a height of an extending portion of the second via; and a molding compound, encapsulating the first chip, the second chip, the first via and the second via.

8. The semiconductor package as claimed in claim 7, wherein surfaces of the first via, the second via and the molding compound are substantially coplanar.

9. The semiconductor package as claimed in claim 1, wherein the first chip further comprises a third via protruding from the first active surface of the first chip.

10. The semiconductor package as claimed in claim 7, wherein the molding compound has a first portion having a first thickness, a second portion having a second thickness different from the first thickness, and a third portion having a third thickness different from the first and second thickness.

11. The semiconductor package as claimed in claim 7, wherein the first via is in direct contact with the molding compound, and the second via is in direct contact with a protection layer encapsulated by the molding compound.

12. The semiconductor package as claimed in claim 11, wherein surfaces of the protection layer, the first via, the second via and the molding compound are substantially coplanar.

13. A semiconductor package, comprising:
a first chip, having a first electrical connector;
a second chip, having a second electrical connector;
a molding compound, wherein a surface of the molding compound is substantially coplanar with surfaces of the first electrical connector and the second electrical connector, and at least one of the first and second electrical connectors is separated from the molding compound.

14. The semiconductor package as claimed in claim 13 further comprising a conductive routing, wherein the first electrical connector and the second electrical connector are disposed between the molding compound and the conductive routing.

15. The semiconductor package as claimed in claim 14, wherein a surface of the conductive routing is substantially flush with the surface of the molding compound.

16. The semiconductor package as claimed in claim 14 further comprising a plurality of conductive terminals on a surface of the conductive routing, wherein the conductive terminals and the molding compound are disposed at opposite sides of the conductive routing.

17. The semiconductor package as claimed in claim 14 further comprising a via in the molding and electrically connected to at least one of the first electrical connector and the second electrical connector.

18. The semiconductor package as claimed in claim 13, wherein a thickness of the first chip is different from a thickness of the second chip.

19. The semiconductor package as claimed in claim 13, wherein the at least one of the first electrical connector and the second electrical connector is separated from the molding compound by a protection layer.

20. The semiconductor package as claimed in claim 19, wherein a surface of the protection layer is substantially coplanar with the surfaces of the molding compound, the first electrical connector and the second electrical connector.

* * * * *